(12) United States Patent
Hsiao

(10) Patent No.: US 11,979,026 B2
(45) Date of Patent: May 7, 2024

(54) WIRELESS CHARGING ASSEMBLY

(71) Applicants: Inventec (Pudong) Technology Corporation, Shanghai (CN); INVENTEC CORPORATION, Taipei (TW)

(72) Inventor: Chi-Cheng Hsiao, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/901,948

(22) Filed: Sep. 2, 2022

(65) Prior Publication Data

US 2023/0387719 A1 Nov. 30, 2023

(30) Foreign Application Priority Data

May 25, 2022 (CN) .......................... 202210580634.3

(51) Int. Cl.
| | |
|---|---|
| *H02J 50/00* | (2016.01) |
| *H02J 50/10* | (2016.01) |
| *H02J 50/40* | (2016.01) |
| *H05K 1/02* | (2006.01) |
| *H05K 1/18* | (2006.01) |

(52) U.S. Cl.
CPC ............ *H02J 50/005* (2020.01); *H02J 50/10* (2016.02); *H02J 50/402* (2020.01); *H05K 1/0203* (2013.01); *H05K 1/181* (2013.01); *H05K 2201/064* (2013.01); *H05K 2201/1003* (2013.01); *H05K 2201/10098* (2013.01)

(58) Field of Classification Search
None
See application file for complete search history.

(56) References Cited

U.S. PATENT DOCUMENTS

| | | | |
|---|---|---|---|
| 2018/0198310 A1* | 7/2018 | Hwang | ................ H02J 7/0042 |
| 2020/0212726 A1* | 7/2020 | Hwang | ................ H04B 5/0037 |
| 2020/0235593 A1* | 7/2020 | Jang | ........................ H02J 50/80 |
| 2020/0335432 A1* | 10/2020 | Murtagian | ........ H01L 21/67144 |

* cited by examiner

*Primary Examiner* — Jared Fureman
*Assistant Examiner* — Joel Barnett
(74) *Attorney, Agent, or Firm* — Locke Lord LLP; Tim Tingkang Xia, Esq.

(57) ABSTRACT

A wireless charging module is configured to be disposed on a circuit board. The wireless charging module includes a frame, a wireless communication antenna board, and a charging coil. The frame has a plurality of first assembly parts and a plurality of second assembly parts. The plurality of first assembly parts are configured to be mounted on the circuit board. The wireless communication antenna board is mounted on the plurality of second assembly parts. The charging coil is located between the frame and the wireless communication antenna board.

6 Claims, 5 Drawing Sheets

WIRELESS CHARGING ASSEMBLY

CROSS-REFERENCE TO RELATED APPLICATIONS

This non-provisional application claims priority under 35 U.S.C. § 119(a) on Patent Application No(s). 202210580634.3 filed in China, on May 25, 2022, the entire contents of which are hereby incorporated by reference.

BACKGROUND OF THE INVENTION

Technical Field of the Invention

The invention relates to a charging module, more particularly to a wireless charging module and a wireless charging assembly.

DESCRIPTION OF THE RELATED ART

To meet the needs of charging the mobile phones, many mobile phones are equipped with wireless charging function. With the use of the wireless charging seats, users can charge their mobile phones in different situations.

However, nowadays, most wireless charging seats merely use plastic shells as support. In the use environment (such as in the car) where users may easily lose their balance, damages to the wireless charging seats may be caused by unintentional pressing by users. Therefore, how to improve the structural strength of the wireless charging devices used in certain environments becomes an issue to be addressed.

SUMMARY OF THE INVENTION

The invention provides a wireless charging module and a wireless charging assembly capable of resisting unintentional pressing by users, thereby preventing damages to the wireless charging seats.

One embodiment of the invention provides a wireless charging module configured to be disposed on a circuit board. The wireless charging module includes a frame, a wireless communication antenna board, and a charging coil. The frame has a plurality of first assembly parts and a plurality of second assembly parts. The plurality of first assembly parts are configured to be mounted on the circuit board. The Wireless communication antenna board is mounted on the plurality of second assembly parts. The charging coil is located between the frame and the wireless communication antenna board.

One embodiment of the invention provides a wireless charging assembly including a circuit board and two wireless charging modules. The circuit board includes a base board and two support assemblies. The base board has a front surface and a back surface opposite to each other. Each of the support assemblies includes a plurality of support pillars. The support pillars protrude from the front surface of the base board. Each of the wireless charging modules includes a frame, a wireless communication antenna board, and a charging coil. The frame has a plurality of first assembly parts and a plurality of second assembly parts. The wireless communication antenna board is mounted on the plurality of second assembly parts. The charging coil is located between the frame and the wireless communication antenna board. The plurality of first assembly parts of the two frames of the two wireless charging modules are respectively mounted on the support pillars of the two support assemblies.

According to the wireless charging module and the wireless charging assembly as described above, since the wireless charging module is provided with the frame, and the first assembly parts and the second assembly parts of the frame are respectively mounted on the circuit board and the wireless communication antenna board, the structural strength of the wireless charging module can be improved. Therefore, the wireless charging module and the wireless charging assembly are capable of resisting unintentional pressing by users, thereby preventing damages to the wireless charging module and the wireless charging assembly.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION

Figure 1:
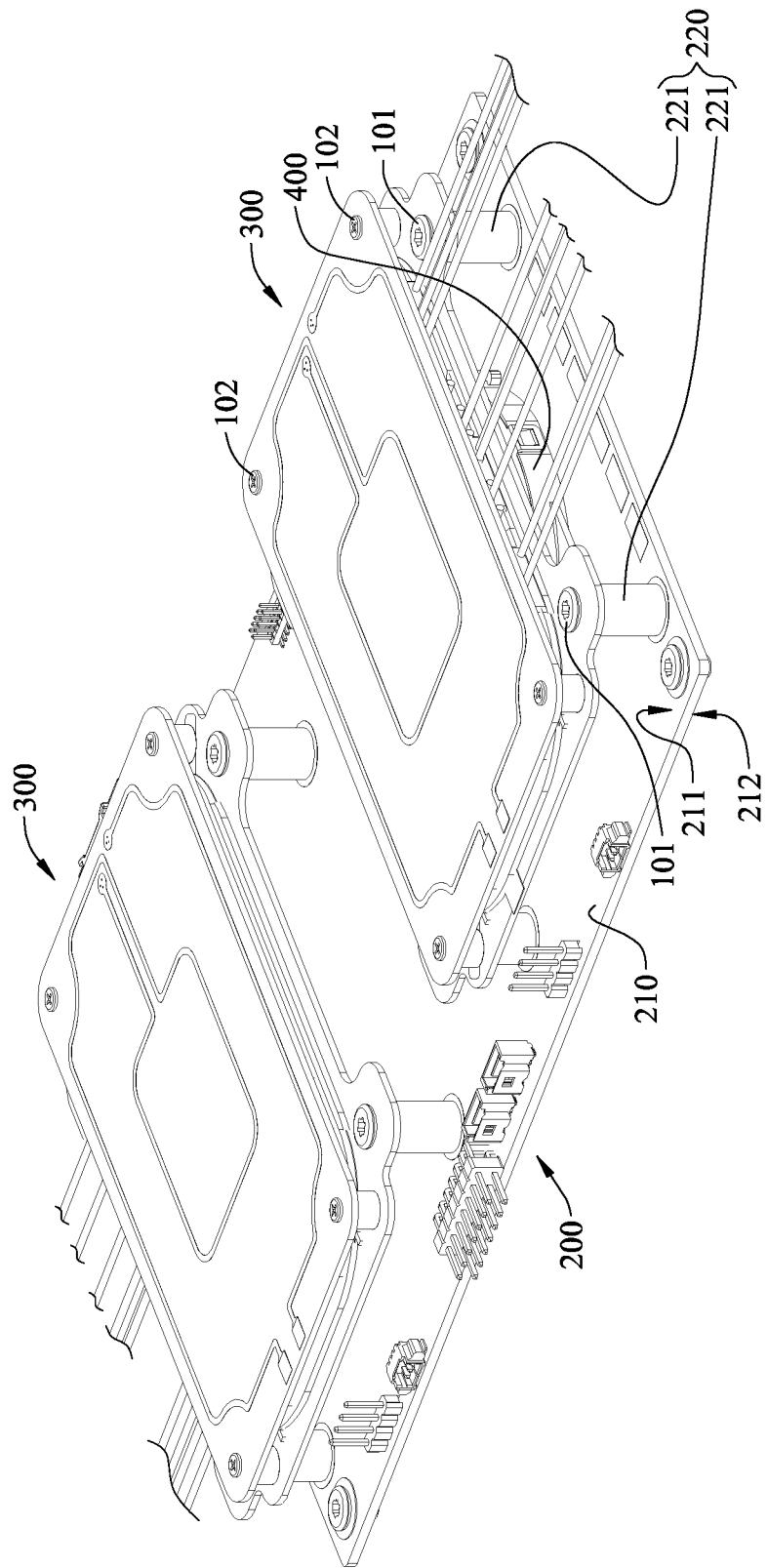
FIG. 1 is a perspective view of a wireless charging assembly in accordance with the first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
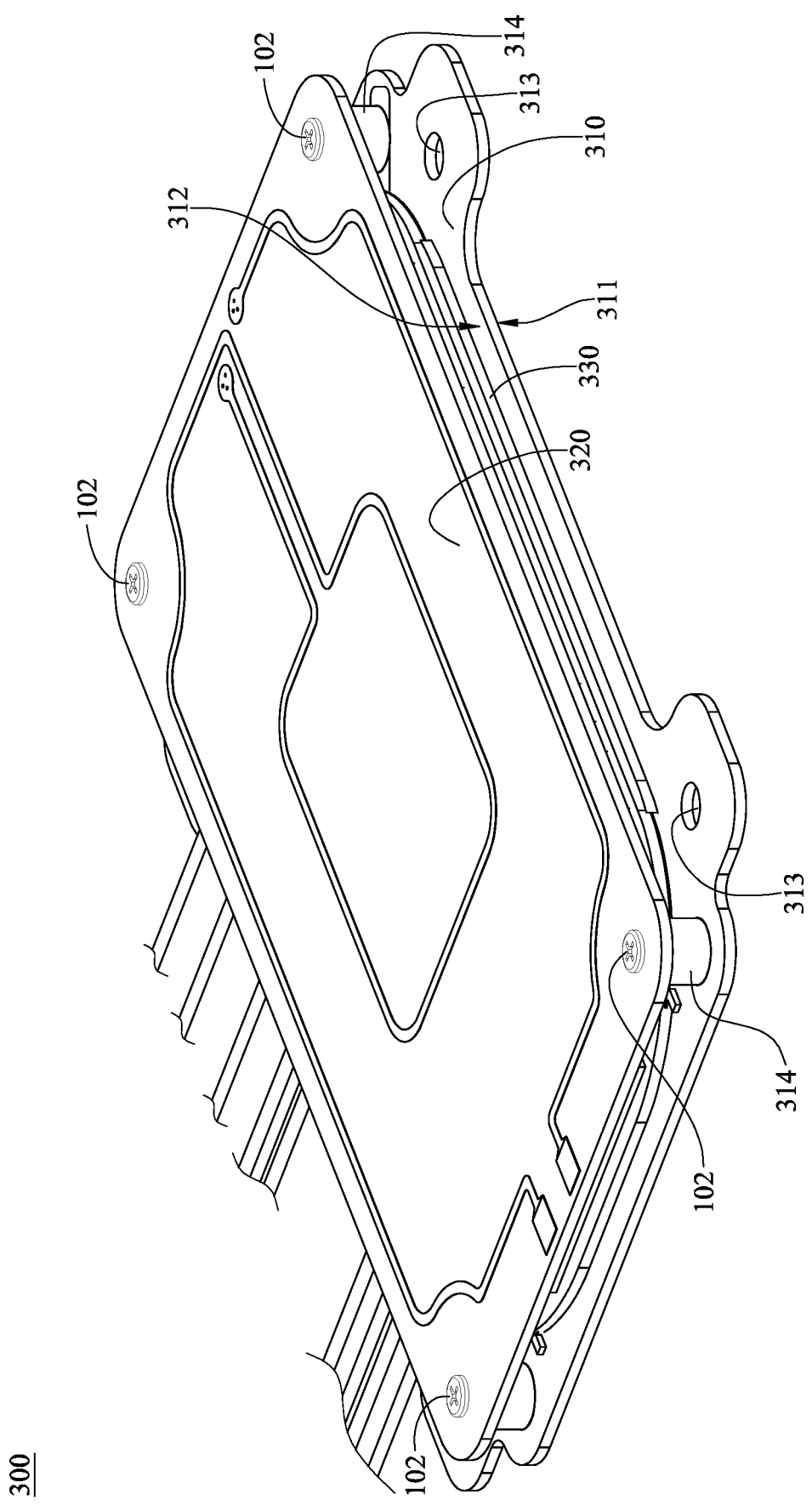
FIG. 2 is a perspective view of a wireless charging module in FIG. 1.
Figure 3:
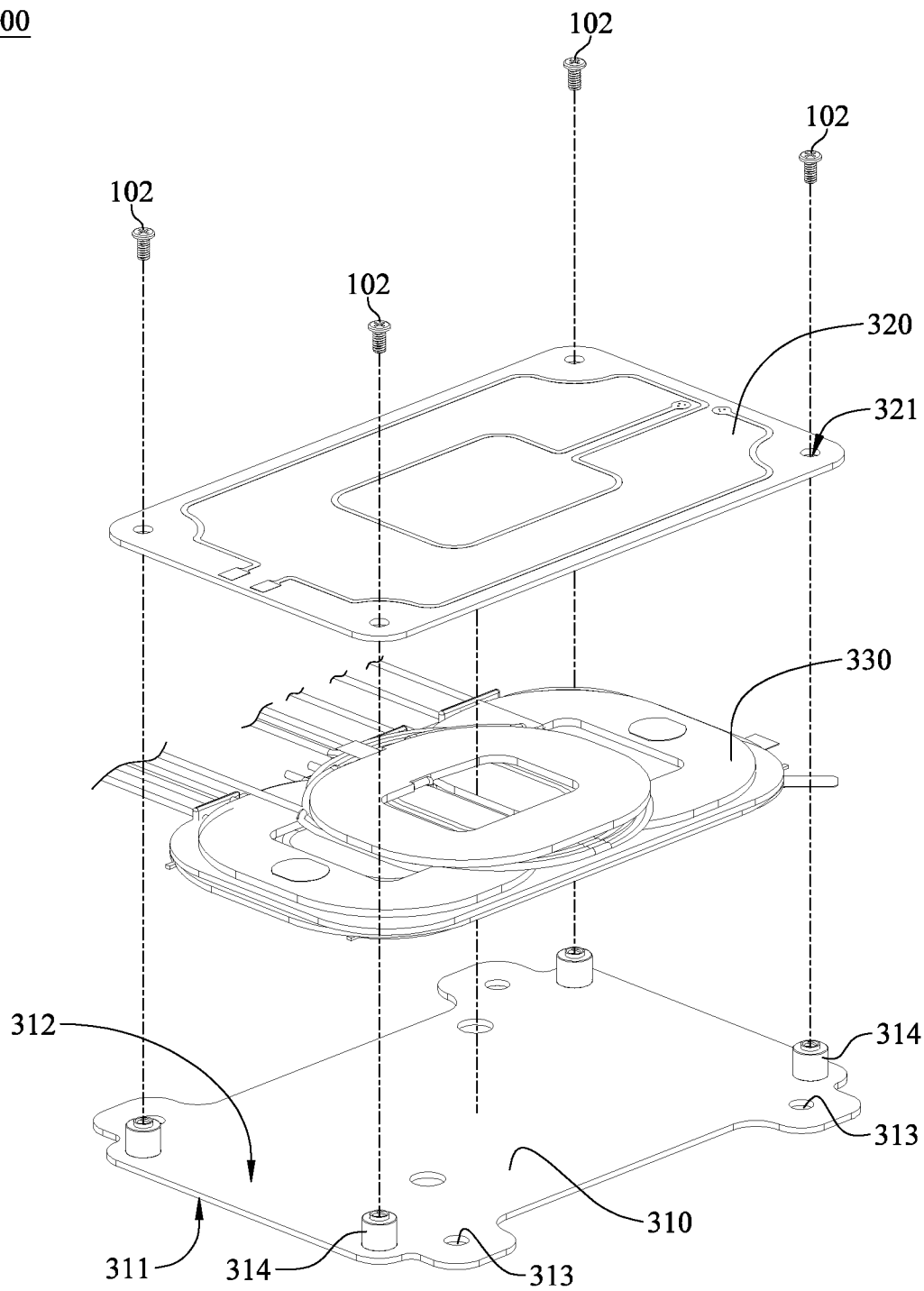
FIG. 3 is an exploded view of FIG. 2.

Referring to FIG. 1 to FIG. 3, where FIG. 1 is a perspective view of a wireless charging assembly in accordance with the first embodiment of the invention, and FIG. 2 is a perspective view of a wireless charging module in FIG. 1, and FIG. 3 is an exploded view of FIG. 2.

In this embodiment, a wireless charging assembly 100 is provided. The wireless charging assembly 100 includes a circuit board 200 and two wireless charging modules 300. In addition, the wireless charging assembly 100 further includes a first fastener 101 and a second fastener 102. The circuit board 200 includes a base board 210 and two support assemblies 220. The base board 210 has a front surface 211 and a back surface 212 located opposite to each other. Electronic components, such as chips, capacitors, resistors, and electrical connectors, are disposed on the front surface 211 of the base board 210. The back surface 212 faces away from the front surface 211. Each of the support assemblies 220 includes a plurality of support pillars 221, and the support pillars 221 protrude from the front surface 211 of the base board 210.

Each of the wireless charging modules 300 includes a frame 310, a wireless communication antenna board 320, and a charging coil 330. The frame 310 is mounted on the circuit board 200. In detail, the frame 310 has a first surface 311, a second surface 312, a plurality of first assembly parts 313, and a plurality of second assembly parts 314. The first surface 311 faces the circuit board 200. The second surface 312 faces away from the first surface 311. The first assembly parts 313 are, for example, through holes passing through the first surface 311 and the second surface 312. The second assembly parts are, for example, coupling nuts protruding from the second surface 312 of the frame 310. The first fasteners 101 are respectively disposed through the first assembly parts 313 and configured to be engaged with the support pillars 221 of the two support assemblies 220, such that the frame 310 can be fixed to the circuit board 200.

In this embodiment, the frames 310 are, for example, aluminum plates, and configured to increase the structural strength of the wireless charging modules 300, but the present invention is not limited thereto. In other embodiments, the frames may be plates made of other materials, such as iron plates, and carbon fiber plates.

Each of the wireless communication antenna boards 320 is, for example, a flexible circuit board, and has a plurality of through holes 321. The second fasteners 102 are, for example, screws respectively disposed through the through holes 321 to be engaged with the second assembly parts 314, such that the wireless communication antenna boards 320 are fixed to the second assembly parts 314 of the frames 310.

In each wireless charging module 300, the charging coil 330 is located between the frame 310 and the wireless communication antenna board 320, and the charging coil 330 is separated from the wireless communication antenna board 320 so as to prevent the communication signal of the wireless communication antenna board from affecting the charging signal of the charging coil 330, thereby improving the charging efficiency of the wireless charging module 300.

In this embodiment, the wireless charging assembly 100 may further include an airflow generator 400. The airflow generator 400 is, for example, a centrifugal fan. The airflow generator 400 is disposed on the first surface 311 of the frame 310, such that the circuit board 200 and the wireless charging module 300 of the wireless charging assembly 100 can be cooled by the airflow generated by the airflow generator 400, but the present invention is not limited thereto. In other embodiments, the airflow generator may be disposed on the circuit board.

Figure 4:
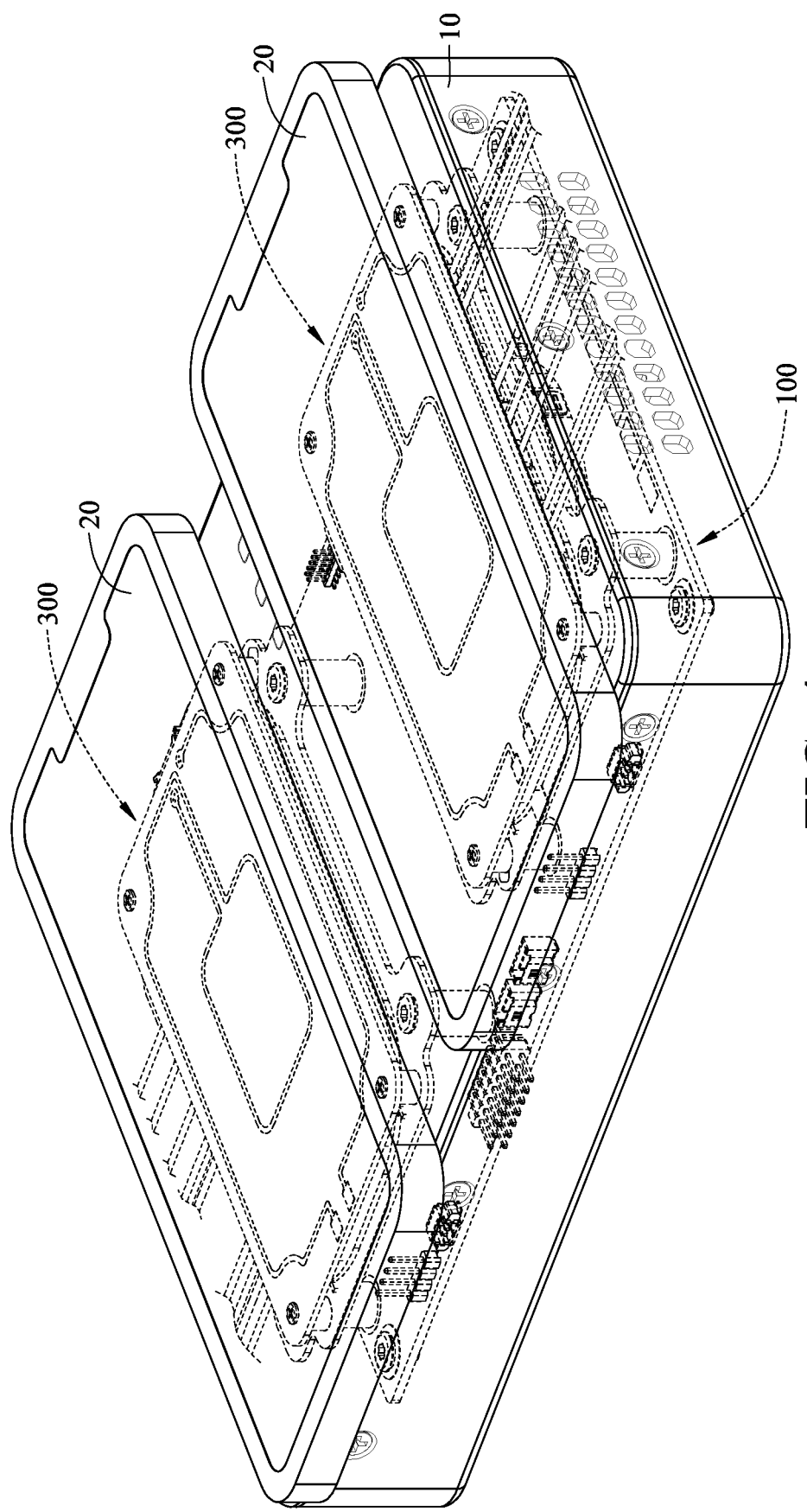
FIG. 4 is a perspective view of a wireless charging assembly located in a casing and the casing carrying mobile devices.
Figure 5:
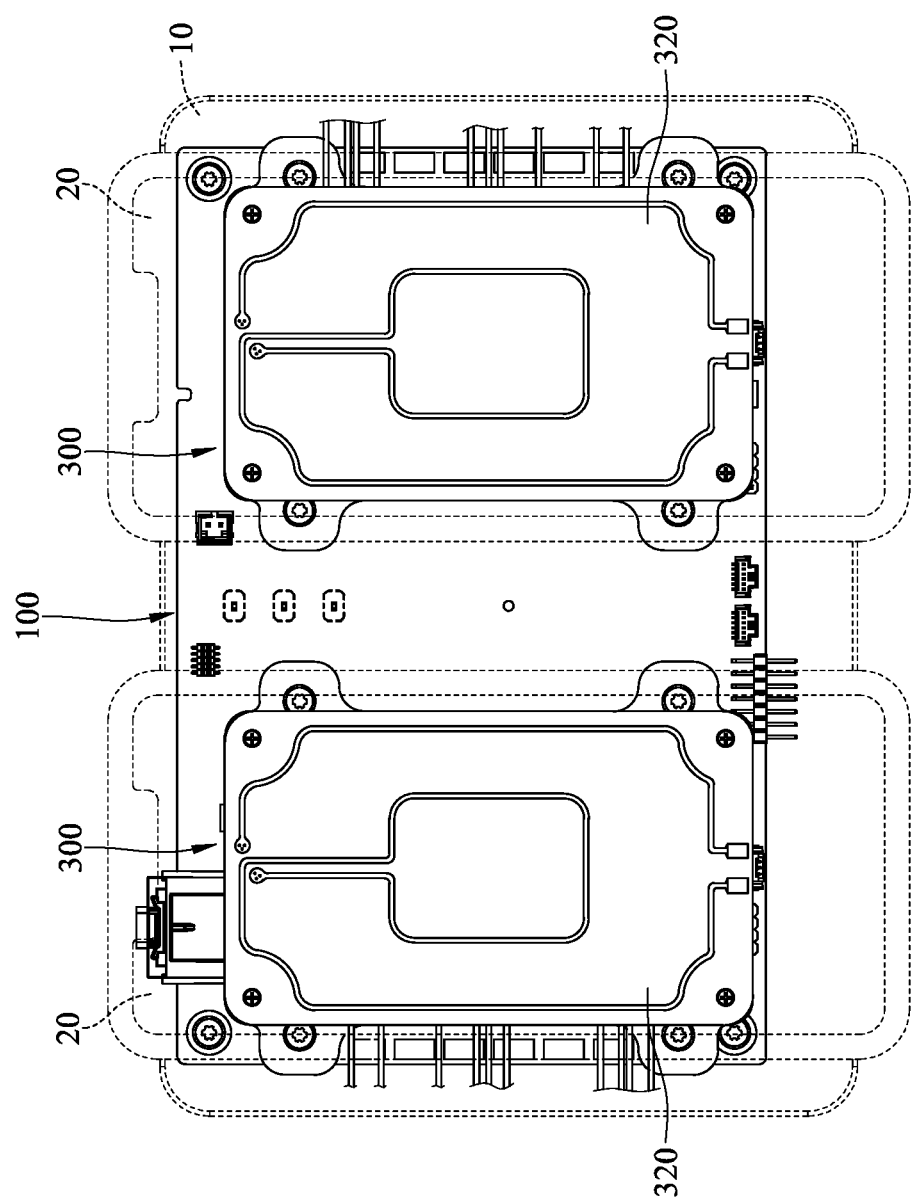
FIG. 5 is a top view of FIG. 4.

Referring to FIG. 3, FIG. 4, and FIG. 5, where FIG. 4 is a perspective view of a wireless charging assembly located in a casing and the casing carrying mobile devices, and FIG. 5 is a top view of FIG. 4. The wireless charging assembly 100 is located in a casing 10, and the casing 10 carries mobile devices 20. Since the wireless charging modules 300 are provided with the frames 310, and the first assembly parts 313 and the second assembly parts 314 of the frames 310 are respectively mounted on the circuit board 200 and the wireless communication antenna boards 320, the structural strength of the wireless charging modules 300 can be further improved.

According to the wireless charging module and the wireless charging assembly as described above, since the wireless charging module is provided with the frame, and the first assembly parts and the second assembly parts of the frame are respectively mounted on the circuit board and the wireless communication antenna board, the structural strength of the wireless charging module can be improved. Therefore, the wireless charging module and the wireless charging assembly are capable of resisting unintentional pressing by users, thereby preventing damages to the wireless charging module and the wireless charging assembly, for example, unexpected damages to the wireless communication antenna board.

In one embodiment of the invention, the wireless charging module and the wireless charging assembly may be applied in vehicle field, such as self-driving vehicle, electric vehicle, and semi-self-driving vehicle.

It will be apparent to those skilled in the art that various modifications and variations can be made to the present invention. It is intended that the specification and examples be considered as exemplary embodiments only, with the scope of the invention being indicated by the following claims and their equivalents.

What is claimed is:
1. A wireless charging assembly, comprising:
a casing;
a circuit board, comprising a base board and two support assemblies, wherein the base board has a front surface and a back surface opposite to each other, and each of the support assemblies comprises a plurality of support pillars protruding from the front surface of the base board; and
two wireless charging modules, and each of the wireless charging modules comprises:
a frame, having a first surface, a second surface, a plurality of first assembly parts and a plurality of second assembly parts, wherein the second surface faces away from the first surface, and the first surface faces the front surface of the circuit board;
a wireless communication antenna board, mounted on the second assembly parts; and
a charging coil, located between the frame and the wireless communication antenna board;
wherein the plurality of first assembly parts of the two frames of the two wireless charging modules are respectively mounted on the plurality of support pillars of the two support assemblies.

2. The wireless charging assembly according to claim 1, further comprising a plurality of first fasteners, wherein in each of the two wireless charging modules, the frame has a first surface and a second surface, the second surface faces away from the first surface, the charging coil is stacked on the second surface, the plurality of first assembly parts are through holes passing through the first surface and the second surface, the plurality of first fasteners are respectively disposed through the plurality of first assembly parts and configured to be engaged with the circuit board.

3. The wireless charging assembly according to claim 2, further comprising a plurality of second fasteners, wherein in each of the two wireless charging modules, the plurality of second assembly parts are mounting pillars protruding from the second surface of the frame, the wireless communication antenna board has a plurality of through holes, and the plurality of second fasteners are respectively disposed through the plurality of through holes of the wireless communication antenna board and respectively engaged with the plurality of second assembly parts.

4. The wireless charging assembly according to claim 1, wherein the charging coils are separated from the wireless communication antenna board.

5. The wireless charging assembly according to claim 2, further comprising an airflow generator disposed on the first surface of one of the frames.

6. A wireless charging assembly, comprising:
- a casing;
- a circuit board, comprising a base board and at least one support assembly, wherein the base board has a front surface and a back surface opposite to each other, and the at least one support assembly comprises a plurality of support pillars protruding from the front surface of the base board; and
- at least one wireless charging module, comprising:
    - a frame, has a first surface, a second surface, a plurality of first assembly parts and a plurality of second assembly parts, wherein the second surface faces away from the first surface, and the first surface faces the front surface of the circuit board;
    - a wireless communication antenna board, having a plurality of through holes, wherein the wireless communication antenna board is mounted on the second assembly parts;
    - a charging coil, located between the frame and the wireless communication antenna board;
    - a plurality of first fasteners; and
    - a plurality of second fasteners;
- wherein the plurality of first fasteners are respectively disposed through the plurality of first assembly parts and configured to be engaged with the plurality of support pillars of the circuit board;
- wherein the plurality of second fasteners are respectively disposed through the plurality of through holes of the wireless communication antenna board and respectively engaged with the plurality of second assembly parts.

* * * * *